United States Patent [19]
Bowden et al.

[11] Patent Number: 5,320,709
[45] Date of Patent: Jun. 14, 1994

[54] METHOD FOR SELECTIVE REMOVAL OF ORGANOMETALLIC AND ORGANOSILICON RESIDUES AND DAMAGED OXIDES USING ANHYDROUS AMMONIUM FLUORIDE SOLUTION

[75] Inventors: Bill Bowden, San Jose; Debbie Switalski, Milpitas, both of Calif.

[73] Assignee: Advanced Chemical Systems International Incorporated, Milpitas, Calif.

[21] Appl. No.: 21,799

[22] Filed: Feb. 24, 1993

[51] Int. Cl.⁵ .............................................. H01L 21/00
[52] U.S. Cl. ................................. 156/667; 156/662; 156/664; 156/665; 156/653; 252/79.1; 252/79.2; 252/79.3; 252/79.4
[58] Field of Search .............. 156/667, 664, 665, 666, 156/662, 652, 653; 252/79.3, 79.4, 79.2, 79.1

[56] References Cited
U.S. PATENT DOCUMENTS

| | | | |
|---|---|---|---|
| 3,979,241 | 9/1976 | Maeda et al. | 156/13 |
| 4,087,367 | 5/1978 | Rioult et al. | 156/656 |
| 4,230,523 | 10/1980 | Gajda | 156/657 |
| 4,252,840 | 2/1981 | Minami | 427/91 |
| 4,269,654 | 5/1981 | Deckert et al. | 156/657 |
| 4,343,677 | 8/1982 | Kinsbron et al. | 156/643 |
| 4,372,807 | 2/1983 | Vossen, Jr. et al. | 156/643 |
| 4,432,132 | 2/1984 | Kinsbron et al. | 29/571 |
| 4,471,524 | 9/1984 | Kinsbron et al. | 29/571 |
| 4,517,106 | 5/1985 | Hopkins et al. | 252/79.4 |
| 4,532,005 | 7/1985 | Grieco et al. | 156/661.1 |
| 4,563,241 | 1/1986 | Tanaka et al. | 156/643 |
| 4,582,624 | 4/1986 | Enjo et al. | 252/79.4 |
| 4,620,934 | 11/1986 | Hopkins et al. | 252/79.4 |
| 5,035,749 | 7/1991 | Haruta et al. | 134/2 |
| 5,219,791 | 6/1993 | Freiberger | 156/644 |

Primary Examiner—R. Bruce Breneman
Assistant Examiner—George Goudreau
Attorney, Agent, or Firm—David H. Jaffer

[57] ABSTRACT

A method for selectively removing oxidized organometallic residues, oxidized organosilicon residues, native oxides, and damaged oxides created in plasma-etching through emersion of plasma-etched silicon wafers in a solution of anhydrous ammonium fluoride and a polyhydric alcohol, which is substantially free of hydrogen fluoride and water.

10 Claims, 2 Drawing Sheets

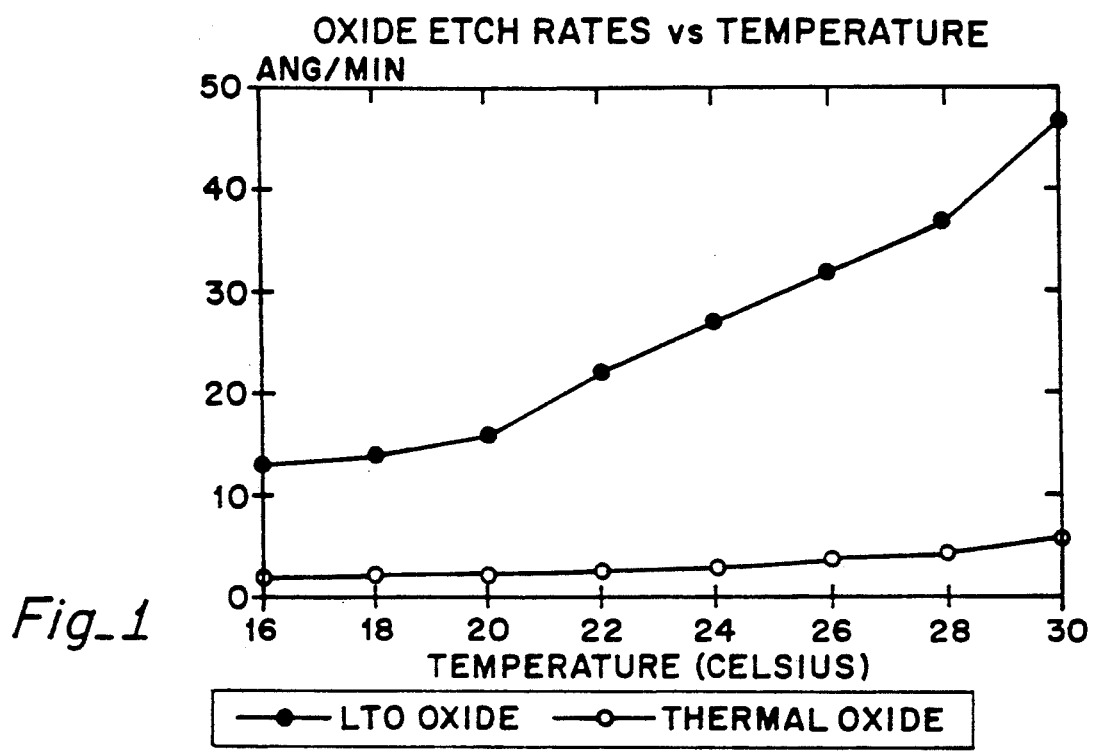
Fig_1
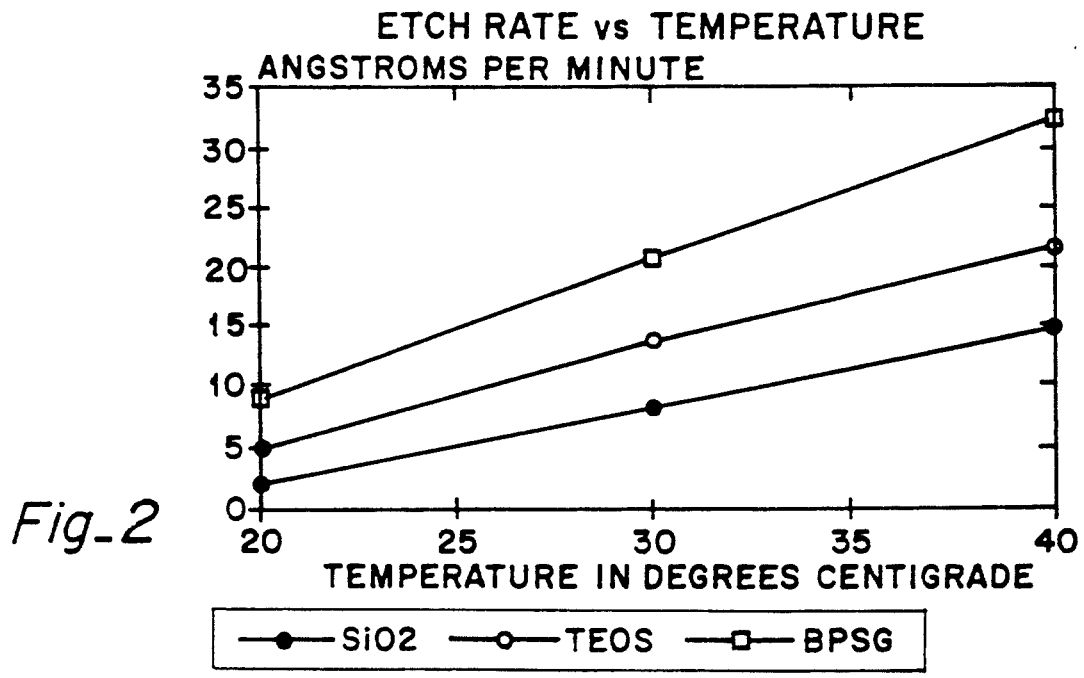
Fig_2

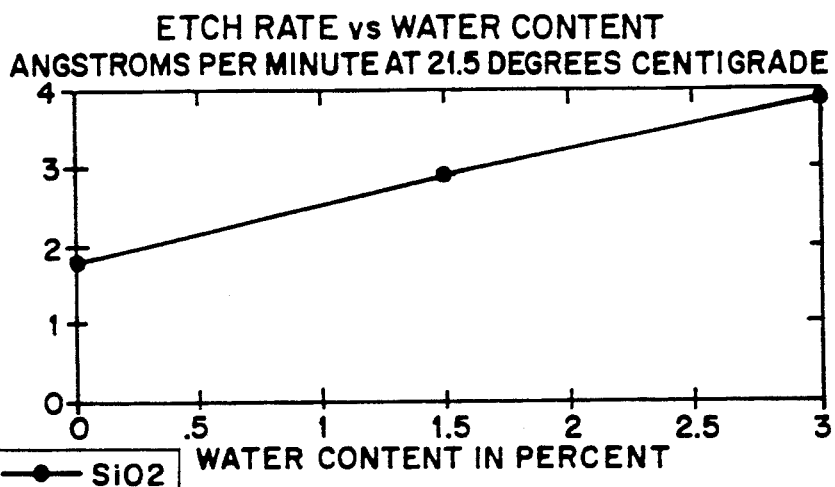
Fig_3
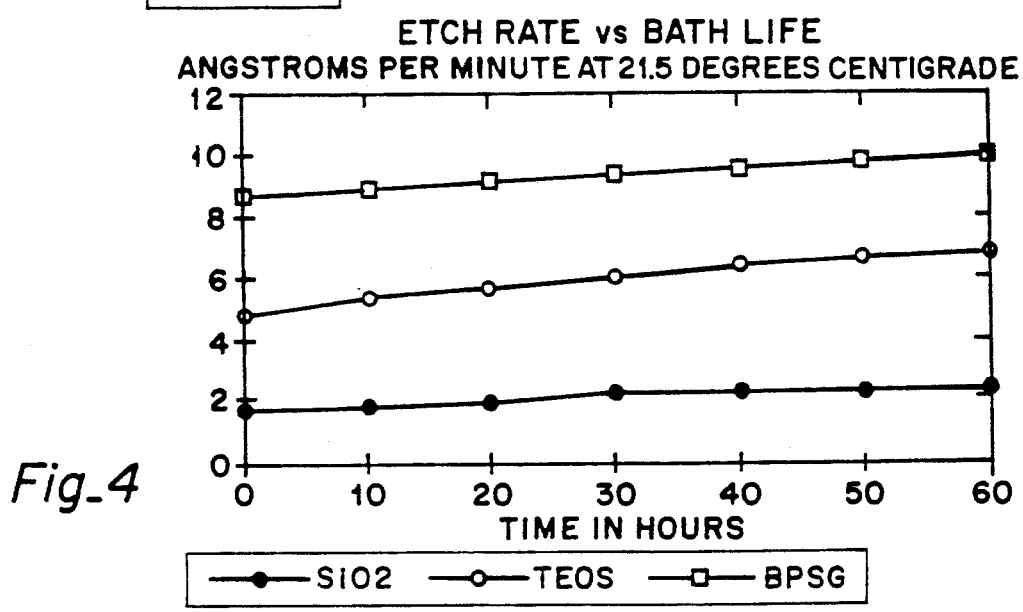
Fig_4
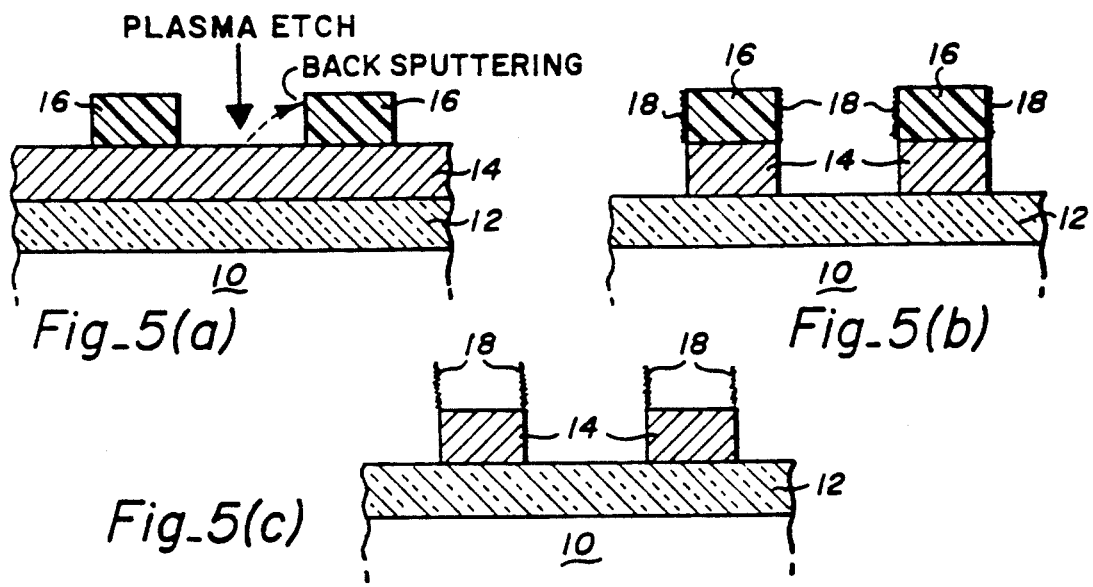
Fig_5(a)   Fig_5(b)
Fig_5(c)

METHOD FOR SELECTIVE REMOVAL OF ORGANOMETALLIC AND ORGANOSILICON RESIDUES AND DAMAGED OXIDES USING ANHYDROUS AMMONIUM FLUORIDE SOLUTION

BACKGROUND OF THE INVENTION

1. Field of the Invention

This invention relates generally to a method for removal of organometallic and organosilicon residues and damaged oxides created in processing of semiconductor wafers, and more particularly to a method for selective removal of such residues and damaged oxides using anhydrous ammonium fluoride in a polyhydric alcohol solution.

2. Brief Description of the Prior Art

Hydrogen fluoride has been widely used in etching processes for patterning films on semiconductor wafers. Hydrogen fluoride has very high etching rates, and therefore a number of alternatives to hydrogen fluoride have been developed. Kinsbron et al., U.S. Pat. No. 4,343,677, discuss film patterning and disclose an etching solution which uses buffered ammonium fluoride/hydrofluoric acid in a molar ratio of about ten to one, mixed with a suitable solvent such as ethylene glycol. Gajda, U.S. Pat. No. 4,230,523, discloses an etchant comprised of a solution of hydrogen fluoride dissolved in organic solvents such as glycerine or another polyhydric alcohol. The etchant is used for etching silicon dioxide while not attacking silicon. Gajda requires that the solution be free of unbound water and ammonium fluoride. Maeda et al., U.S. Pat. No. 3,979,241, teach an etching liquid with ammonium fluoride or an alkali fluoride dissolved in a polyhydric alcohol, such as ethylene glycol, polyethylene glycol, and glycerine. The etching solution is used for selectively etching silicon dioxide or silicon nitride on a semiconductor wafer.

SUMMARY OF THE INVENTION

It is a primary object of the present invention to provide an improved method for removal from processed semiconductor Wafers of oxidized organometallic residues resulting from plasma etching of metals and metal alloys, and for removal of oxidized organosilicon residues from plasma-etched silicon.

Another object of the present invention is to provide an improved method for removal of oxidized organometallic and organosilicon residues from "vias", i.e. from pathways connecting layers in a multi-layer chip pattern.

A further object of the present invention is to provide a method for selective removal of native oxides (i.e. non-furnace grown oxides) and damaged oxides created in plasma-etching of semiconductor substrates (damaged oxides are oxides in which the crystal lattice is not uniform due to impurities or damage created in plasma-etching).

Briefly, the preferred embodiment of the present invention is a method for selectively removing oxidized organometallic residues, oxidized organosilicon residues, native oxides, and damages oxides created in plasma-etching through emersion of plasma-etched silicon wafers in a solution of anhydrous ammonium fluoride and a polyhydric alcohol, which is substantially free of hydrogen fluoride and water.

IN THE DRAWING

FIGS. 1 and 2 are graphs showing oxide etch rates versus temperature;

FIG. 3 is a graph showing variation in etch rates with different water content in the etching solution;

FIG. 4 is a graph showing etch rates for different types of oxide over the bath life containing the solution;

FIGS. 5(a) and 5(b) are simplified drawings of an etching process in accordance with this invention; and FIG. 5(c) is a simplified drawing of the type of residue which remains if an organometallic residue created in plasma-etching is inadequately removed.

DETAILED DESCRIPTION OF THE PREFERRED EMBODIMENT

This invention provides a method for removal of organometallic residues, organosilicon residues, and damaged oxides created in plasma-etching, as well as a method for removal of native oxides, for use in semiconductor processing. Plasma-etching of silicon wafers patterned with photoresist can create organometallic residues, organosilicon residues, and damaged oxides. Oxidized organometallic and organosilicon residues and damaged oxides may be found in vias and the planar field of semiconductor substrates after plasma-etching. These residues and damaged oxides are undesirable, as they impair the resolution of desirable features on the semiconductor surface and shorten device life. Therefore, it is desirable to remove these residues and oxides. This invention provides an improved method for removal of unwanted residues and oxides with a controlled etching process.

The etching process is controlled through use of a solution of anhydrous ammonium fluoride in a polyhydric alcohol, preferably ethylene glycol or glycerol. The solution is preferably as free of water as possible. The mechanism of the etching process is believed to involve dissociation of the ammonium fluoride to hydrogen fluoride and ammonia in a small quantity.

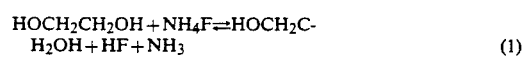

$$HOCH_2CH_2OH + NH_4F \rightleftharpoons HOCH_2CH_2OH + HF + NH_3 \quad (1)$$

The equilibrium constant for this dissociation strongly favors the left side. Thus, a very small amount of hydrogen fluoride is present in the solution. No hydrogen fluoride is added; the amount present is from dissociation of ammonium fluoride. The absence of water prevents creation of $H_3O+$, and the pH of the ammonium fluoride/ethylene glycol solution is essentially neutral. Evolved hydrogen fluoride does not undergo a substantial ionization reaction, which would increase acidity, as in a standard HF system (because of the absence of water). In the preferred embodiment, the solution of ammonium fluoride and polyhydric alcohol contains less that 0.50% water. Etch rates are slower in this solution than in a solvent system including water, and etching can be done selectively and with more control.

The composition used in the method described herein is preferably composed of anhydrous ammonium fluoride dissolved in a polyhydric alcohol such as ethylene glycol, glycerol, propylene glycol, polyethylene glycol, polymethylene glycol, etc. In addition, the use of a surfactant aids in the removal of residue oxides by increasing wetting of the semiconductor surface by the solvent system. The surfactants in the preferred embodiment are non-ionic surfactants, but other surfactants would be suitable.

Anhydrous ammonium fluoride is dissolved in the polyhydric alcohol used. In the preferred embodiment, 4% anhydrous ammonium fluoride (by weight) is dissolved in ethylene glycol. Smaller amounts of ammonium fluoride yield slower etch rates, and larger amounts may be used but are limited by the solubility of ammonium fluoride in the polyhydric alcohol used. Alternatively, anhydrous ammonium bifluoride ($NH_2HF_2$) may be used. Ammonium bifluoride yields higher etch rates.

The solution provides a controlled release of hydrogen fluoride from the precursor compound, anhydrous ammonium fluoride The controlled release permits preferential etching of damaged oxides or deposited oxides resulting from plasma-etch processes without disrupting existing thermal field oxides (i.e. furnace grown silicon dioxide). This is because thermal oxides are uniform and have higher density and lower surface area than plasma-etch oxides (oxidized organometallics and organosilicon residues) or damaged silicon oxides. Similarly, native oxides (non-furnace grown oxides, which have lower density than furnace grown thermal field oxides) may be preferentially etched without disrupting thermal field oxides.

Since the anhydrous ammonium fluoride/polyhydric alcohol solution will selectively etch non-thermal oxides, areas of photoresist will be exposed which were coated by such oxides during plasma-etching. This will permit better removal of residual photoresist when a photoresist stripper is used.

With reference to FIG. 1, the difference in etching rates for a low temperature oxide (LTO), such as an oxide created in plasma etching (e.g. oxidized organometallics and organosilicons) and thermal field silicon dioxide is shown. The solution used is 4% anhydrous ammonium fluoride (by weight) in ethylene glycol. As is evident from the graph, the low temperature oxide can be selectively removed because of its higher etch rate. Of particular importance is the significant difference in etch rate at low temperature (15° to 30° Celsius).

With reference to FIG. 2, another illustration of the variation of etch rate with temperature is shown. The etch solution is 4% anhydrous ammonium fluoride in ethylene glycol. Again, the etch rate for a thermal oxide (silicon dioxide) is significantly lower that the etch rate for tetraethylorthosilicate (TEOS) and boron phosphorous silicon glass (BPSG).

The importance of reducing water content in the solvent system is illustrated in FIG. 3, which shows that the etch rate for thermal silicon dioxide rises significantly with water content. This example also is for 4% ammonium fluoride in ethylene glycol.

With reference to FIG. 5, a simple drawing of the etch process is shown. In FIG. 5(a), a silicon dioxide layer 12 lies on top of a silicon wafer 10. Above the silicon dioxide layer 12 is an aluminum layer 14, upon which lies patterned photoresist 16. Aluminum layer 14 is then etched in a plasma-etch process, which causes some back-sputtering of aluminum onto the patterned photoresist 16. The patterned photoresist becomes coated with an alumino-organic compound, which will resist stripping and also will prevent clean removal of the photoresist by a photoresist stripper.

FIG. 5(b) shows the alumino-organic compound 18 on the photoresist 16 after plasma etching of the aluminum 14. With use of the method disclosed herein, the alumino-organic compound 18 is removed, thereby exposing a clean photoresist layer which may be removed with a photoresist stripper.

FIG. 5(c) shows that, in the absence of removal of the alumino-organic compound, the oxidized alumino-organic compound 18 (a "sidewall polymer") would remain as a residue. This illustration is illustrious of plasma etching of aluminum, but similar processes and residues are involved in any plasma etching, polysilicon etching, and via etching.

A typical example of wafer processing using the method of this invention is as follows: Photoresist patterned semiconductor wafers are plasma-etched. The wafers are then emersed in the etch solution of 4% by weight anhydrous ammonium fluoride in ethylene glycol at 22° Centigrade for about 20 minutes. After emersion, the wafers are rinsed with de-ionized water and spin-dried. Next, the photoresist on the wafers is stripped with a suitable stripper. The wafers are then rinsed with de-ionized water and spin-dried.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method for selectively removing organometallic residues, organosilicon residues, native silicon oxides, or damaged silicon oxides created in processing a semiconductor substrate from said semiconductor substrate, comprising contacting said semiconductor substrate with an etching solution for a time sufficient to remove said organometallic residues, organosilicon residues, native silicon oxides, or damaged silicon oxides from said semiconductor substrate, wherein (a) said etching solution comprises an anhydrous ammonium fluoride salt dissolved in a polyhydric alcohol, said anhydrous ammonium fluoride salt selected from the group consisting of anhydrous ammonium fluoride and anhydrous ammonium bifluoride and mixtures thereof, and (b) said etching solution contains less than about 4% by weight water and is free of added hydrogen fluoride.

2. The method of claim 1, wherein the polyhydric alcohol is selected from the group consisting of ethylene glycol, glycerol, propylene glycol, polyethylene glycol, polymethylene glycol, and mixtures thereof.

3. The method of claim 1, wherein the polyhydric alcohol is ethylene glycol

4. The method of claim 1, wherein said etching solution comprises from 0.5% to 10% by weight anhydrous ammonium salt and from 90% to 99.5% by weight polyhydric alcohol.

5. The method of claim 4, wherein said etching solution contains less than 0.5% by weight water.

6. The method of claim 1, wherein the anhydrous ammonium salt is anhydrous ammonium fluoride.

7. The method of claim 6, wherein the polyhydric alcohol is selected from the group consisting of ethylene glycol, glycerol, propylene glycol, polyethylene glycol, polymethylene glycol, and mixtures thereof.

8. The method of claim 7, wherein the polyhydric alcohol is ethylene glycol.

9. The method of claim 6, wherein said etching solution comprises from 0.5% to 10% by weight anhydrous ammonium fluoride and from 90% to 99.5% by weight polyhydric alcohol 10. The method of claim 9, Wherein said etching solution contains less than 0.5% by weight water.

* * * * *